United States Patent
Zhou et al.

(10) Patent No.: US 12,209,011 B2
(45) Date of Patent: Jan. 28, 2025

(54) HYBRID DRIVING FOR LARGE APERTURE TILTING MIRRORS

(71) Applicant: Beijing Voyager Technology Co., Ltd., Beijing (CN)

(72) Inventors: Qin Zhou, Livermore, CA (US); Youmin Wang, Mountain View, CA (US)

(73) Assignee: Beijing Voyager Technology Co., Ltd., Beijing (CN)

( * ) Notice: Subject to any disclaimer, the term of this patent is extended or adjusted under 35 U.S.C. 154(b) by 652 days.

(21) Appl. No.: 17/369,829

(22) Filed: Jul. 7, 2021

(65) Prior Publication Data

US 2023/0008705 A1     Jan. 12, 2023

Related U.S. Application Data

(63) Continuation-in-part of application No. 16/224,754, filed on Dec. 18, 2018, now Pat. No. 11,181,734.

(51) Int. Cl.
| | |
|---|---|
| *G02B 26/08* | (2006.01) |
| *B81B 5/00* | (2006.01) |
| *G01S 7/481* | (2006.01) |
| *G02B 26/10* | (2006.01) |

(52) U.S. Cl.
CPC .............. *B81B 5/00* (2013.01); *G01S 7/4817* (2013.01); *G02B 26/085* (2013.01); *G02B 26/101* (2013.01); *B81B 2201/042* (2013.01)

(58) Field of Classification Search
CPC ... B81B 5/00; B81B 2201/042; G01S 7/4817; G02B 26/085; G02B 26/101
See application file for complete search history.

(56) References Cited

U.S. PATENT DOCUMENTS

| | | |
|---|---|---|
| 2001/0048265 A1 | 12/2001 | Miller et al. |
| 2002/0008922 A1 | 1/2002 | Conant et al. |
| 2002/0171327 A1 | 11/2002 | Miller et al. |
| 2003/0122206 A1 | 6/2003 | Bhattarai et al. |
| 2003/0223676 A1* | 12/2003 | Bernstein ............... G02B 6/358 385/17 |
| 2008/0130081 A1 | 6/2008 | Tsai et al. |
| 2008/0204861 A1 | 8/2008 | Shiraishi |
| 2011/0228370 A1 | 9/2011 | Tsai et al. |
| 2015/0160561 A1 | 6/2015 | Saenger et al. |

(Continued)

*Primary Examiner* — Euncha P Cherry
(74) *Attorney, Agent, or Firm* — Kilpatrick Townsend & Stockton LLP

(57) ABSTRACT

A microelectromechanical system MEMS structure is described. A first actuator is attached to a substrate and configured to rotate the substrate along a first axis of rotation. An array of rotatable MEMS mirrors is mounted on the substrate, aligned parallel to the first axis of rotation. Each rotatable MEMS mirror is rotatable about a second axis of rotation with each second axis of rotation being perpendicular to the first axis of rotation and parallel to every other axis of rotation. An array of second actuators is configured to rotate each of the rotatable MEMS mirrors about its corresponding second axis of rotation. A controller is configured to control the first actuator to rotate the substrate about the first axis of rotation. The controller further controls the array of second actuators to rotate each rotatable MEMS mirror of the array of rotatable MEMS mirrors about its corresponding second axis of rotation.

20 Claims, 10 Drawing Sheets

(56) References Cited

U.S. PATENT DOCUMENTS

| | | |
|---|---|---|
| 2019/0113790 A1 | 4/2019 | Hakoi et al. |
| 2019/0121121 A1 | 4/2019 | Galinski, III et al. |
| 2020/0013181 A1 | 1/2020 | Uyeno et al. |
| 2020/0192082 A1* | 6/2020 | Zhou .................. G02B 26/0833 |

* cited by examiner

HYBRID DRIVING FOR LARGE APERTURE TILTING MIRRORS

CROSS-REFERENCES TO RELATED APPLICATIONS

This application is a continuation-in-part (CIP) of U.S. Non-Provisional patent application Ser. No. 16/224,754, filed, Dec. 18, 2018, issued as U.S. Pat. No. 11,181,734 and titled "MICROMACHINED MIRROR ASSEMBLY HAVING MICRO MIRROR ARRAY AND HYBRID DRIVING METHOD THEREOF," which is incorporated by reference in its entirety into the present application for all purposes.

BACKGROUND

Unless otherwise indicated herein, the materials described in this section are not prior art to the claims in this application and are not admitted to be prior art by inclusion in this section. In particular, disparate technologies are discussed that it would not be obvious to discuss together absent the teachings of the present invention.

Modern vehicles are often equipped with sensors designed to detect objects and landscape features around the vehicle in real-time to enable technologies such as lane change assistance, collision avoidance, and autonomous driving. Some commonly used sensors include image sensors (e.g., infrared or visible light cameras), acoustic sensors (e.g., ultrasonic parking sensors), radio detection and ranging (RADAR) sensors, magnetometers (e.g., passive sensing of large ferrous objects, such as trucks, cars, or rail cars), and light detection and ranging (LiDAR) sensors.

A LiDAR system typically uses a light source and a light detection system to estimate distances to environmental features (e.g., pedestrians, vehicles, structures, plants, etc.). For example, a LiDAR system may transmit a light beam (e.g., a pulsed laser beam) to illuminate a target and then measure the time it takes for the transmitted light beam to arrive at the target and then return to a receiver near the transmitter or at a known location. In some LiDAR systems, the light beam emitted by the light source may be steered across a two-dimensional or three-dimensional region of interest according to a scanning pattern to generate a "point cloud" that includes a collection of data points corresponding to target points in the region of interest. The data points in the point cloud may be dynamically and continuously updated and may be used to estimate, for example, a distance, dimension, location, and speed of an object relative to the LiDAR system.

In a LiDAR system, light steering is used. Light steering typically involves the projection of light in a pre-determined direction to facilitate, for example, the detection and ranging of an object, the illumination and scanning of an object, or the like. Light steering can be used in many different fields of applications including, for example, autonomous vehicles or medical diagnostic devices, and can be configured to perform both transmission and reception of light. For example, a light steering transmitter may include a micromirror to control the projection direction of light to detect/image an object. Moreover, a light steering receiver may also include a micro-mirror to select a direction of incident light to be detected by the receiver to avoid detecting other unwanted signals.

Tilting mirrors have applications in numerous optical systems. In many cases, the optical aperture of a system is determined by the mirror size. A larger optical aperture is preferred in various scenarios. While this can be achieved through increasing mirror sizes, this solution can sacrifice other performance, such as the operating speed of the mirrors. An alternative approach is to use arrays of identical, smaller mirrors, where the total size of the array is equal in size to a larger mirror. The total effective aperture is thereby increased over any of the smaller, individual mirrors. A problem with this approach is that each individual mirror in the array needs to be synchronized so all mirrors are tilted in the same direction at any given time. In an ideal system where every mirror is identical, this is achieved as long as the driving signal applied to each mirror is identical. Previous solutions have sought to mechanically couple each mirror to synchronize their movement. However, this coupling only solves the synchronization in one direction as mechanical interference prevents the coupling to be realized in two orthogonal tilting axes (e.g. an x and y scanning axis of a LiDAR).

BRIEF SUMMARY

Techniques disclosed herein relate generally to tilting mirrors in optical systems. More specifically, and without limitation, disclosed herein is an apparatus and method for synchronously driving an array of mirrors in two dimensions.

In some embodiments, a microelectromechanical System (MEMS) structure is described. In these embodiments, a first actuator is attached to a substrate and configured to rotate the substrate along a first axis of rotation. An array of rotatable MEMS mirrors is mounted on the substrate and aligned parallel to the first axis of rotation. Each rotatable MEMS mirror is rotatable about a second axis of rotation with each second axis of rotation being perpendicular to the first axis of rotation and parallel to every other axis of rotation. An array of second actuators is mounted on the substrate and configured to rotate each of the rotatable MEMS mirrors about its corresponding second axis of rotation. Some embodiments further comprises a controller configured to control the first actuator to rotate the substrate about the first axis of rotation over a first range of motion. The controller further controls the array of second actuators to rotate each rotatable MEMS mirror of the array of rotatable MEMS mirrors about its corresponding second axis of rotation over a second range of motion.

According to certain embodiments, the substrate may be a printed circuit board (PCB). The array of rotatable MEMS mirrors and array of second actuators may also be formed on a semiconductor chip. In some embodiments, the semiconductor chip, comprising the array of rotatable MEMS mirrors and array of second actuators, may be mounted on the PCB. The array of second actuators may comprise an electrostatic comb, configured to rotate each corresponding rotatable MEMS mirror about its second axis of rotation.

According to certain embodiments, the controller is configured to cause the first actuator to rotate the substrate about the first axis of rotation in a first frequency range of 1 Hz to 15 Hz, inclusive. The controller can be further configured to cause the array of second actuators to rotate each of the rotatable MEMS mirrors at a second frequency in the kilohertz range.

In other embodiments, a method for operating a MEMS structure to redirect light in a light detection and ranging system (LiDAR) is described. The controller sends a first control signal to a first actuator. In response to the first control signal, the first actuator rotates the substrate about a first axis of rotation. The controller also sends a second control signal to an array of second actuators on a semiconductor chip mounted on the substrate. In response to the second control signal, the array of second actuators cause each rotatable MEMS mirror in an array of rotatable MEMS mirrors on the semiconductor chip to rotate about a second axis of rotation. Each second axis of rotation is perpendicular to the first axis of rotation and parallel to every other axis of rotation.

The terms and expressions that have been employed are used as terms of description and not of limitation, and there is no intention in the use of such terms and expressions of excluding any equivalents of the features shown and described or portions thereof. It is recognized, however, that various modifications are possible within the scope of the systems and methods claimed. Thus, it should be understood that, although the present system and methods have been specifically disclosed by examples and optional features, modification and variation of the concepts herein disclosed should be recognized by those skilled in the art, and that such modifications and variations are considered to be within the scope of the systems and methods as defined by the appended claims.

This summary is not intended to identify key or essential features of the claimed subject matter, nor is it intended to be used in isolation to determine the scope of the claimed subject matter. The subject matter should be understood by reference to the appropriate portions of the entire specification of this disclosure, any or all drawings, and each claim.

The foregoing, together with other features and examples, will be described in more detail below in the following specification, claims, and accompanying drawings.

BRIEF DESCRIPTION OF THE DRAWINGS

The features of the various embodiments described above, as well as other features and advantages of certain embodiments of the present invention, will be more apparent from the following detailed description taken in conjunction with the accompanying drawings, in which.

DETAILED DESCRIPTION

Figure 1:
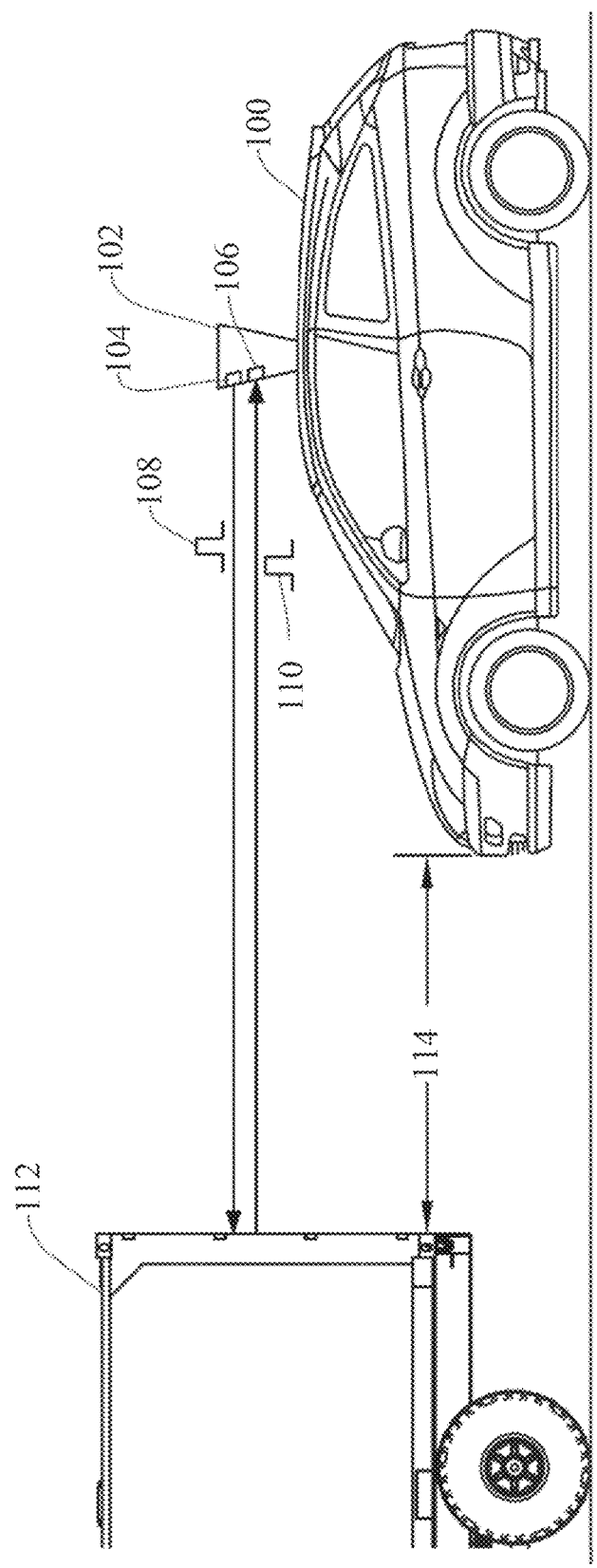
FIG. 1 shows an autonomous vehicle with a LiDAR system, according to certain embodiments.

Embodiments of the present disclosure relate generally to an optical system, and more particularly to a LiDAR system scanning an environment with a laser and MEMS-based mirrors, and in particular the two-dimensional synchronization of rotatable MEMS mirrors to improve performance of the LiDAR system.

In the following description, various examples of mirror structures are described. For purposes of explanation, specific configurations and details are set forth in order to provide a thorough understanding of the embodiments. However, it will be apparent to one skilled in the art that certain embodiments may be practiced or implemented without every detail disclosed. Furthermore, well-known features may be omitted or simplified in order to prevent any obfuscation of the novel features described herein.

The following high-level summary is intended to provide a basic understanding of some of the novel innovations depicted in the figures and presented in the corresponding descriptions provided below. Techniques disclosed herein relate generally to rotatable microelectromechanical (MEMS) mirrors that can be used in, for example, light detection and ranging (LiDAR) systems or other light beam steering systems. More specifically, and without limitation, disclosed herein are embodiments that provide a method and mechanism for synchronizing the rotation of each rotatable mirror in an array of rotatable MEMS mirrors about two orthogonal axes.

In summary, in some embodiments, a microelectromechanical system (MEMS) structure (400, 500) includes a substrate (404), such as a printed circuit board (PCB). An electromagnetic actuator (510, 511, 512, 513, & 506) rotates the PCB about a first axis of rotation (501). An array of rotatable MEMS mirrors is formed on a semiconductor chip (502) mounted to the PCB and aligned parallel to the first axis of rotation. Each rotatable MEMS mirror is rotatable about a second axis of rotation (405) perpendicular to the first axis of rotation. In some embodiments, the MEMS mirrors are rotated (tilted) by electrostatic actuators (comb fingers 306, terminals 310, 314) while the PCB is rotated with the electromagnetic actuator. A controller (514) controls the actuators through a driver (516).

The detailed discussion below and accompanying figures will first describe a general LiDAR system incorporating embodiments. Next, the mirror structure that operates at a resonant frequency is described. That is followed by a detailed description of an array of rotatable MEMS mirrors. Next, a hybrid drive system that can drive an array of rotatable MEMS mirrors synchronously in two dimensions is described. Next are control systems that can drive actuators of different types and at different frequencies such that two-dimensional scanning is achieved, and the computer systems for controlling the control systems.

Generally, embodiments of the invention are directed to implementations of light steering, which can be used in a number of different applications. For example, a Light Detection and Ranging (LiDAR) module of an autonomous vehicle may incorporate a light steering system. The light steering system can include a transmitter and receiver system to steer emitted incident light in different directions around a vehicle and to receive reflected light off of objects around the vehicle using a sequential scanning process, which can be used to determine distances between the objects and the vehicle to facilitate autonomous navigation.

Light steering can be implemented by way of micromirror assemblies as part of an array, with each micro-mirror assembly having a movable micro-mirror and an actuator (or multiple actuators). The micro-mirrors and actuators can be formed as microelectromechanical systems (MEMS) on a semiconductor substrate, which allows for the integration of the MEMS with other circuitries (e.g., controller, interface circuits, etc.) on the semiconductor substrate which can allow for simpler, easier, more robust, and cost-effective manufacturing processes.

In a micro-mirror assembly, a micro-mirror can be mechanically connected (e.g., "anchored") to the semiconductor substrate via a connection structure (e.g., torsion bar, torsion spring, torsion beam, etc.) to form a pivot point and an axis of rotation. As described herein, "mechanically connected," or "connected," can include a direct connection or an indirect connection. For example, the micro-mirror can be indirectly connected to the substrate via a connection structure (e.g., torsion bar or torsion spring) to form a pivot/connection point. The micro-mirror can be rotated around the pivot/connection point ("referred to herein as a pivot point") on the axis of rotation by an actuator. An electrostatic actuator is typically used; however, any suitable type of actuator may be implemented (e.g., piezoelectric, thermal mechanical, etc.), and one of ordinary skill in the art with the benefit of this disclosure would appreciate the many modifications, combinations, variations, and alternative embodiments thereof.

In some embodiments, each micro-mirror can be configured to be rotated by a rotation angle or moved vertically to reflect (and steer) light towards a target direction. For rotation, the connection structure can be deformed to accommodate the rotation, but the connection structure also has a degree of spring stiffness, which varies with the rotation angle and counters the rotation of the micro-mirror to set a target rotation angle. To rotate a micro-mirror by a target rotation angle, an actuator can apply a torque to the micro-mirror based on the rotational moment of inertia of the mirror, as well as the degree of spring stiffness for a given target rotation angle. Different torques can be applied to rotate (e.g., oscillate) the micro-mirror at or near a resonant frequency to achieve different target rotation angles. The actuator can then remove the torque, and the connection structure can return the micro-mirror back to its default orientation for the next rotation. A vertical actuator, such as an electrostatic force actuator or a thermal actuator with a piston, can be used in embodiments. The rotation or vertical displacement of the micro-mirror can be repeated in the form of an oscillation, typically at or near a resonant frequency of the micro-mirror based on the mass of the micro-mirror and the spring constant of the connection structure.

One of ordinary skill in the art with the benefit of this disclosure would appreciate the many implementations and alternative embodiments thereof.

Typical System Environment for Certain Embodiments of the Invention

FIG. 1 illustrates an autonomous vehicle 100 in which the various embodiments described herein can be implemented. Autonomous vehicle 100 can include a LiDAR module 102. LiDAR module 102 allows autonomous vehicle 100 to perform object detection and ranging in a surrounding environment. Based on the result of object detection and ranging, autonomous vehicle 100 can drive according to the rules of the road and maneuver to avoid a collision with detected objects. LiDAR module 102 can include a light steering transmitter 104 and a receiver 106. Light steering transmitter 104 can project one or more light signals 108 at various directions (e.g., incident angles) at different times in any suitable scanning pattern, while receiver 106 can monitor for a light signal 110 which is generated by the reflection of light signal 108 by an object. Light signals 108 and 110 may include, for example, a light pulse, a frequency modulated continuous wave (FMCW) signal, and an amplitude modulated continuous wave (AMCW) signal. LiDAR module 102 can detect the object based on the reception of light signal 110 and can perform a ranging determination (e.g., a distance of the object) based on a time difference between light signals 108 and 110, as would be appreciated by one of ordinary skill in the art with the benefit of this disclosure. For example, as shown in FIG. 1, LiDAR module 102 can transmit light signal 108 at a direction directly in front of autonomous vehicle 100 at time T1 and receive light signal 110 reflected by an object 112 (e.g., another vehicle) at time T2. Based on the reception of light signal 110, LiDAR module 102 can determine that object 112 is directly in front of autonomous vehicle 100. Moreover, based on the time difference between T1 and T2, LiDAR module 102 can also determine a distance 114 between autonomous vehicle 100 and object 112. Autonomous vehicle 100 can thereby adjust its speed (e.g., slowing or stopping) to avoid collision with object 112 based on the detection and ranging of object 112 by LiDAR module 102.

Figure 2A:
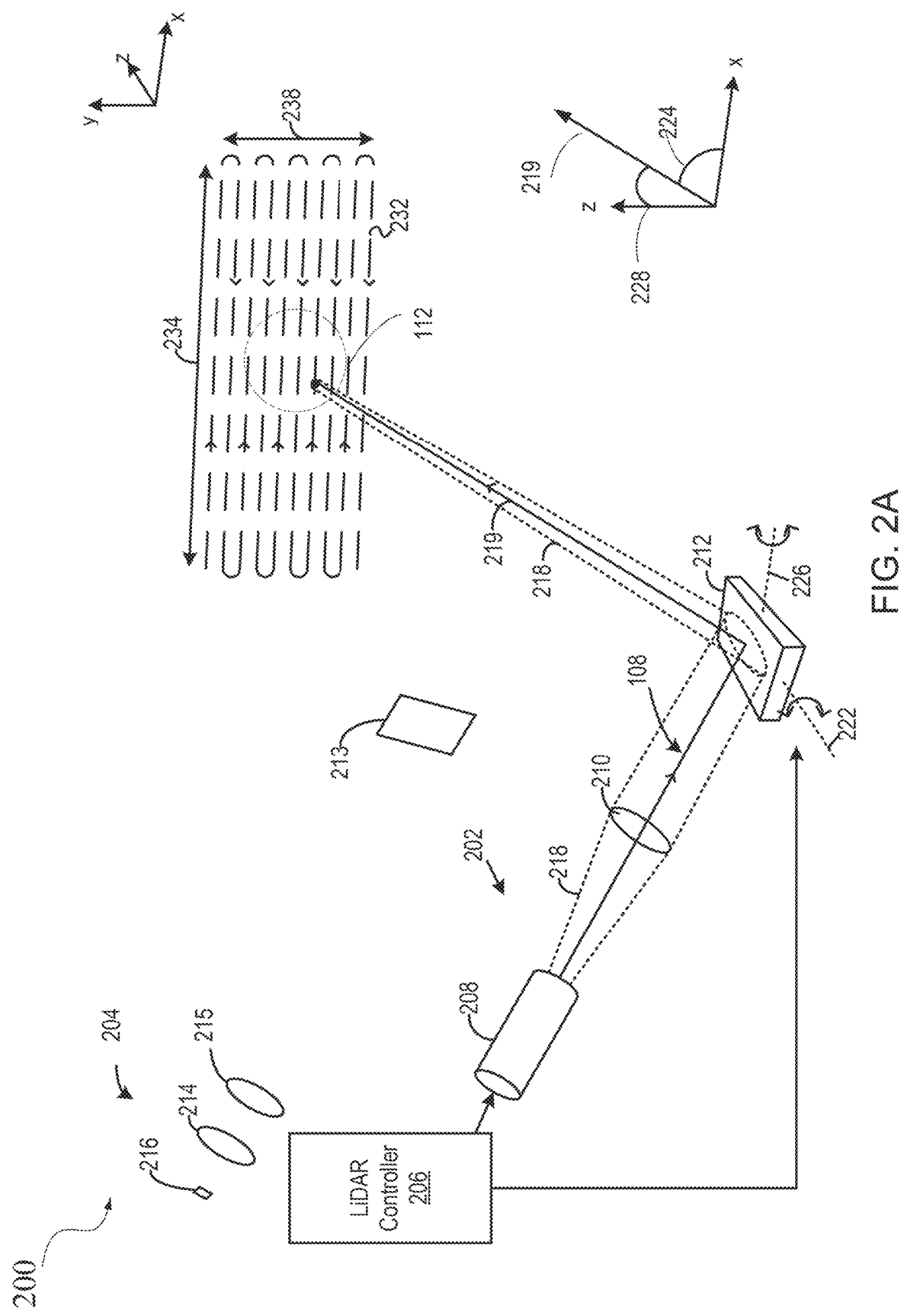
FIG. 2A shows an example of a light projection operation, according to certain embodiments.
Figure 2B:
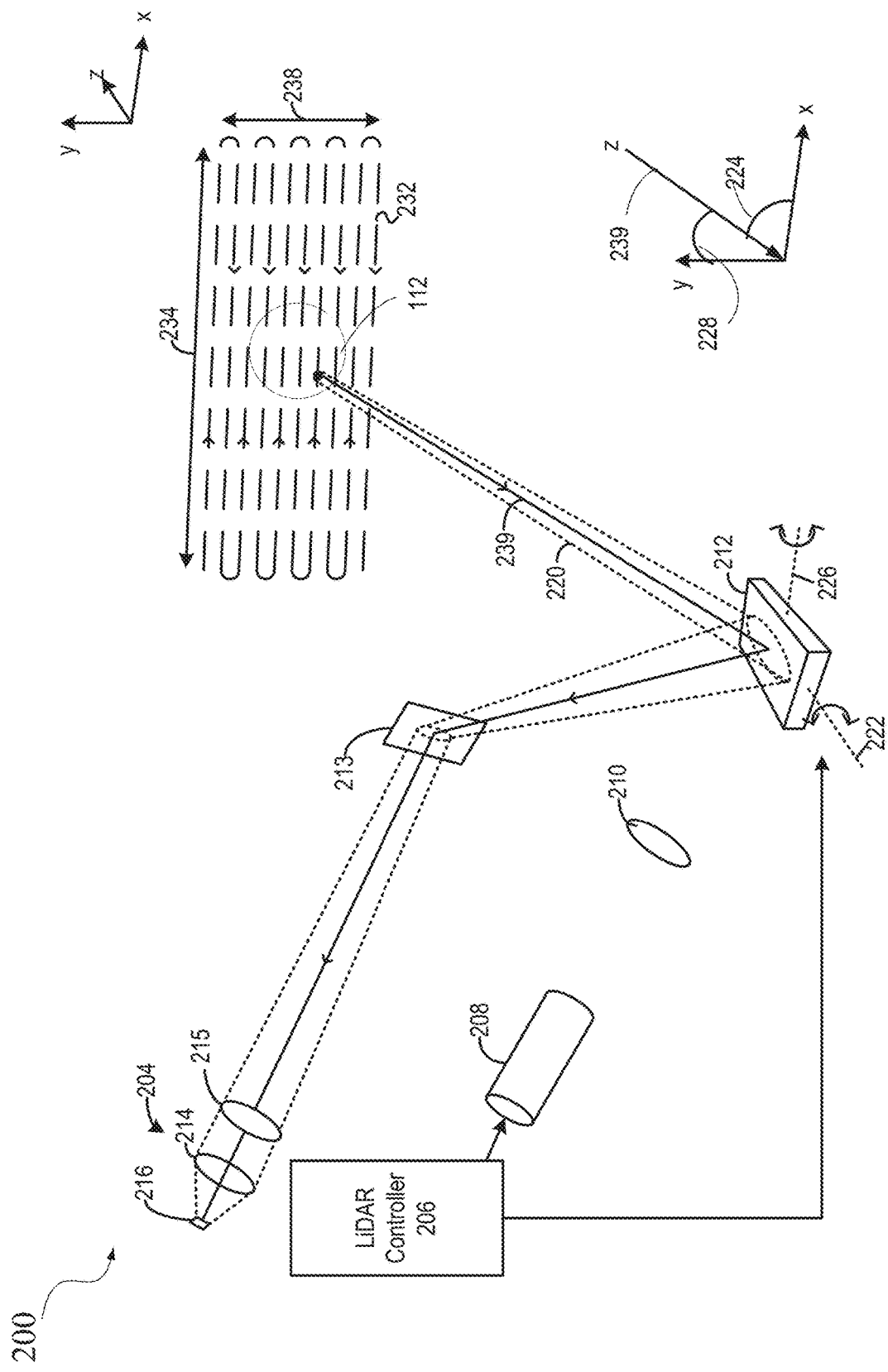
FIG. 2B shows an example of a light detection operation, according to certain embodiments.

FIG. 2A and FIG. 2B illustrate simplified block diagrams of an example of a LiDAR module 200 according to certain embodiments. LiDAR module 200 may be an example of LiDAR system 102 and may include a transmitter 202, a receiver 204, and LiDAR controller 206, which may be configured to control the operations of transmitter 202 and receiver 204. Transmitter 202 may include a light source 208 and a collimator lens 210, and receiver 204 can include a lens 214, an optional filter 215 and a photodetector 216. LiDAR module 200 may further include a mirror assembly 212 (also referred to as a "mirror structure") and a beam splitter 213. In some embodiments, LiDAR module 102, transmitter 202 and receiver 204 can be configured as a coaxial system to share mirror assembly 212 to perform light steering operations with beam splitter 213 configured to reflect incident light reflected by mirror assembly 212 to receiver 204.

FIG. 2A shows an example of a light projection operation according to certain embodiments. To project light, LiDAR controller 206 can control light source 208 (e.g., a pulsed laser diode, a source of FMCW signal, AMCW signal) to transmit light signal 108 as part of light beam 218. Light beam 218 can disperse upon leaving light source 208 and can be converted into collimated light beam 218 by collimator lens 210. Collimated light beam 218 can be incident upon a mirror assembly 212, which can reflect collimated light beam 218 to steer it along an output projection path 219 towards object 112. Mirror assembly 212 can include one or more rotatable mirrors. FIG. 2A illustrates mirror assembly 212 as having one mirror; however, a micro-mirror array may include multiple micro-mirror assemblies that can collectively provide the steering capability described herein. Mirror assembly 212 can further include one or more actuators (not shown in FIG. 2A) to rotate the rotatable mirrors. The actuators can rotate the rotatable mirrors around a first axis 222 and can rotate the rotatable mirrors along a second axis 226. The rotation around first axis 222 can change a first angle 224 of output projection path 219 with respect to a first dimension (e.g., the x-axis), whereas the rotation around second axis 226 can change a second angle 228 of output projection path 219 with respect to a second dimension (e.g., the z-axis). LiDAR controller 206 can control the actuators to produce different combinations of angles of rotation around first axis 222 and second axis 226, such that the movement of output projection path 219 can follow a scanning pattern 232. A range 234 of movement of output projection path 219 along the x-axis, as well as a range 238 of movement of output projection path 219 along the z-axis, can define a FOV. An object within the FOV, such as object 112, can receive and reflect collimated light beam 218 to form a reflected light signal, which can be received by receiver 204 and detected by the LiDAR module, as further described below with respect to FIG. 2B. In certain embodiments, mirror assembly 212 can include one or more comb spines with comb electrodes (see, e.g., FIG. 3), as will be described in further detail below.

FIG. 2B shows an example of a light detection operation, according to certain embodiments. LiDAR controller 206 can select an incident light direction 239 for detection of incident light by receiver 204. The selection can be based on setting the angles of rotation of the rotatable mirrors of mirror assembly 212, such that only light beam 220 propagating along light direction 239 gets reflected to beam splitter 213, which can then divert light beam 220 to photodetector 216 via collimator lens 214 and an optional filter 215. With such arrangements, receiver 204 can selectively receive signals that are relevant for the ranging/ imaging of object 112 (or any other object within the FOV), such as light signal 110 generated by the reflection of collimated light beam 218 by object 112, and not to receive other signals. As a result, the effect of environmental disturbance on the ranging and imaging of the object can be reduced, and the system performance may be improved.

Mirror Structure

Figure 3A:
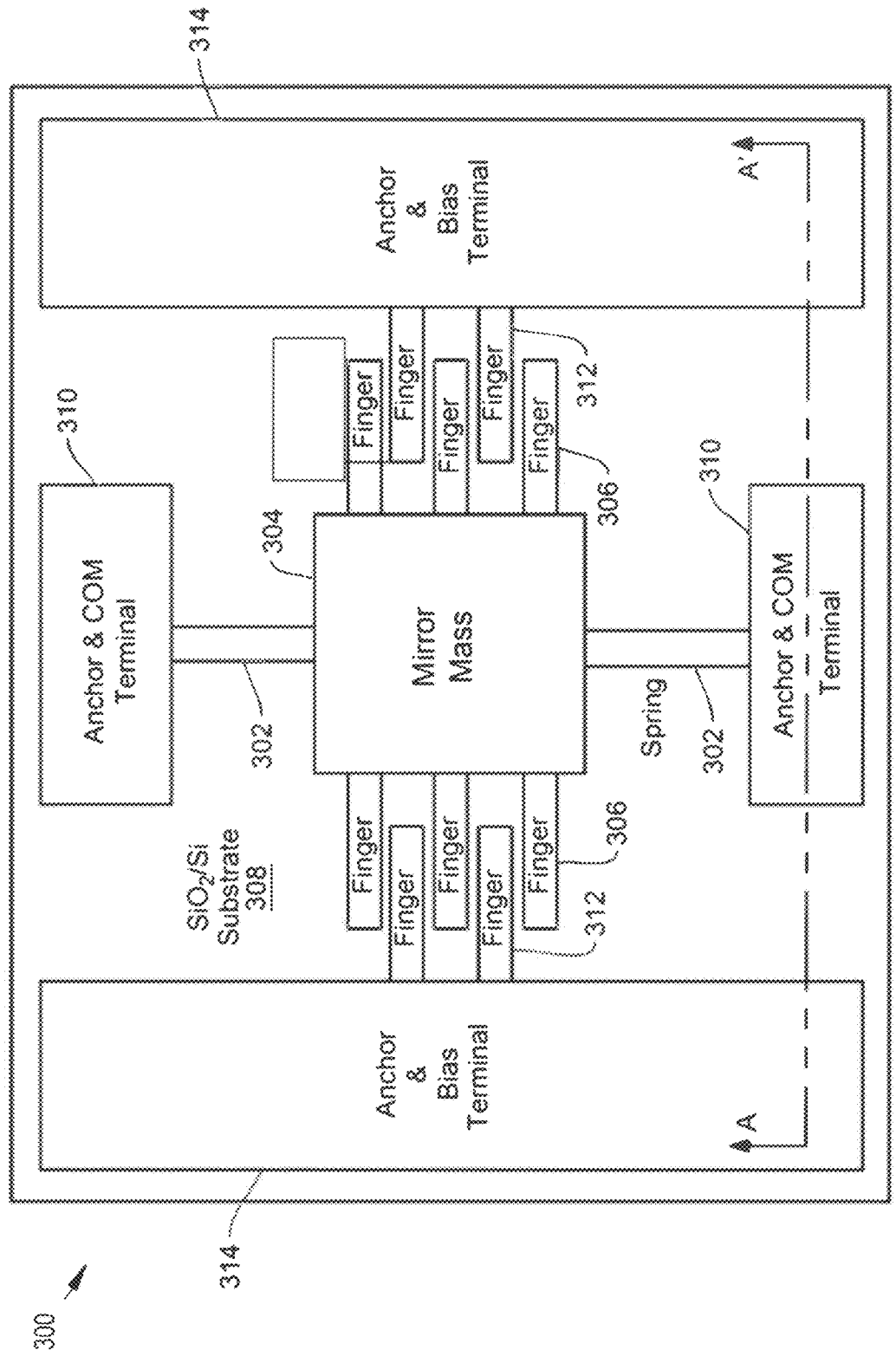
FIG. 3A is a diagram of a rotatable MEMS mirror.

FIG. 3A is a diagram of the structure of a rotatable MEMS mirror. FIG. 3A shows a typical electrostatic MEMS mirror structure 300, also referred to herein as a "MEMS mirror" or "rotatable MEMS mirror" with springs (torsion beams) 302, a mirror mass 304, and comb fingers 306 and 312. The mirror mass 304 is suspended by mechanical springs or torsion beams 302 which are typically anchored in a $SiO_2$/ silicon substrate 308 and anchored at anchor and COM (sometimes referred to as simply "common" or "COM") terminals 310. Comb fingers 306 are connected to mirror mass 304, and are interleaved with comb fingers 312 connected to anchor and bias (sometimes referred to as simply "bias") terminals 314. Terminals 310 provide for common (COM) with the mirror, both providing a driving voltage and sensing a change in capacitance between the fingers 306 connected to mirror mass 304 and interleaved fingers 312 connected to anchor and bias terminals 314. Anchor and bias terminals 314 are connected to a voltage bias, which is typically a combination of a DC and an AC voltage. The comb fingers and COM and bias terminals comprise a comb actuator.

Figure 3B:
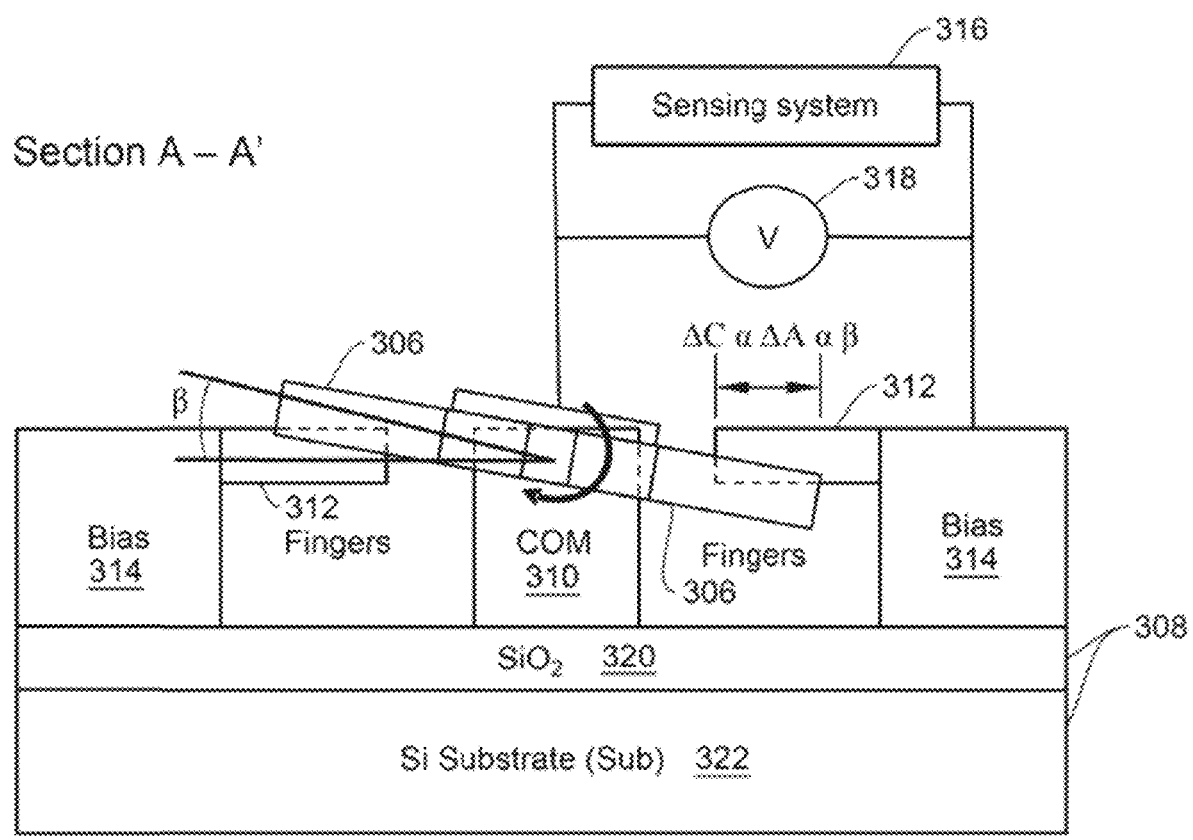
FIG. 3B is a sectional view of FIG. 3A along lines A-A'.

FIG. 3B is a sectional view of FIG. 3A along lines A-A'. As can be seen from FIG. 3B, mirror mass 304 tilts when a driving voltage 318 (V) is applied across the comb fingers 306 and 312 between COM terminal 310 and bias terminal 314. Since the overlap area in the fingers changes along with the mirror mass displacement, the capacitance of the comb fingers changes proportionally and it is sensed by sensing system 316 and used as feedback to control the motion of the mirror mass. As shown, the overlap between the fingers 306 and 312 changes with a change in capacitance ($\Delta C$) that is proportional to the change in overlap area ($\Delta A$), which is proportional to the tilt angle $\beta$.

In some embodiments, an array of MEMS mirrors is used. The mirrors from the array are interconnected mechanically and electrically so they can be synchronized. All the connections are around the entire array; isolating each mirror affects the optical performance by reducing the fill factor. Utilizing an array of MEMS mirrors instead of a larger mirror can increase the effective aperture of the optic within a LiDAR system without necessarily sacrificing other performance such as operating speed.

Figure 4:
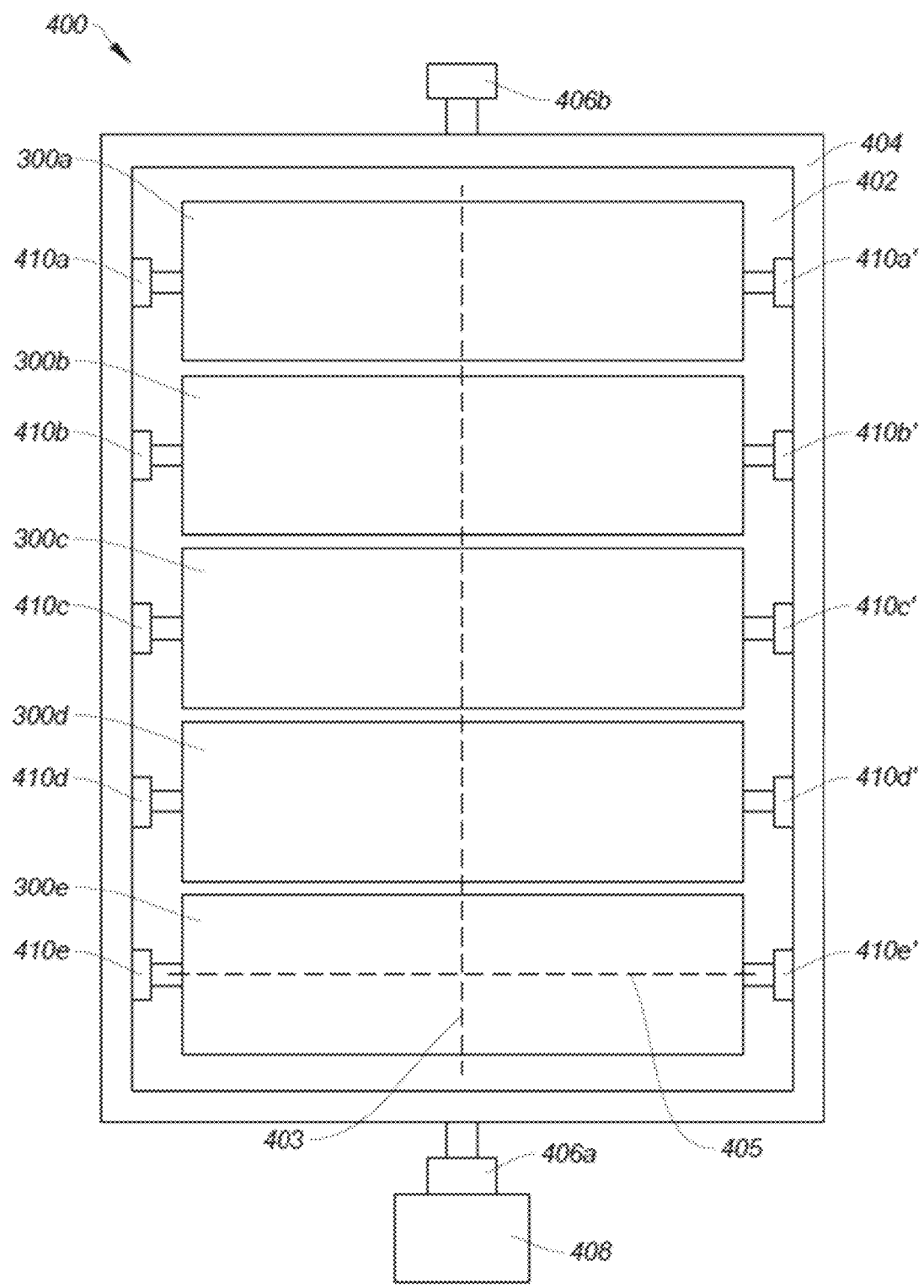
FIG. 4 is a simplified diagram of a MEMS structure including an array of rotatable MEMS mirrors mounted on a substrate.

FIG. 4 is a simplified diagram of a MEMS structure including an array of rotatable MEMS mirrors mounted on a substrate. In the example shown in FIG. 4, MEMS structure 400 utilizes an array of rotatable MEMS mirrors (such as those shown in FIGS. 3A and 3B) to increase the effective optical aperture in a LiDAR system. FIG. 4 shows an array of rotatable MEMS mirrors 300 a-e formed on a semiconductor chip 402, mounted on substrate 404. Substrate 404 can be a printed circuit board (PCB). Substrate 404 can also include rotatable connectors 406 a and b which is operable to pass an electronic signal from a controller (for example controller 514 in FIG. 5) outside of substrate 404 via a metal trace (e.g., aluminum) or other suitable method. Although two rotatable connectors 406 a and b are shown, other embodiments may include more or a single, cantilevered connector.

Figure 5:
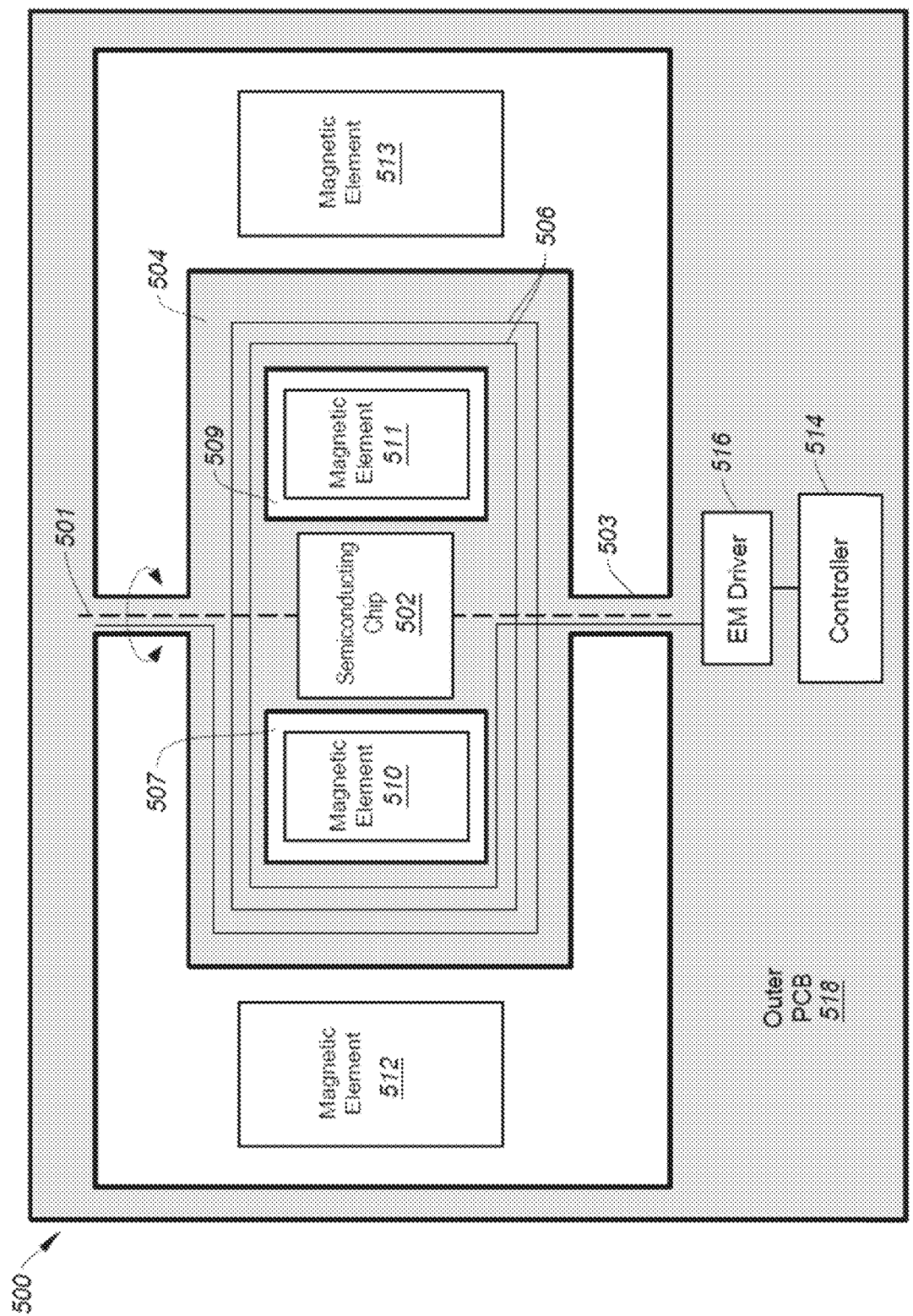
FIG. 5 is a block diagram of MEMS structure with an electromagnetic actuator, according to certain embodiments.

Rotatable connector 406 is connected to actuator 408. Actuator 408 can receive a signal from a controller (for example controller 514 in FIG. 5) and then cause substrate 404 to rotate about axis of rotation 403 around a predetermined range of motion. Actuator 408 can be configured to operate at a suitable frequency. An example of suitable frequencies are 1 Hz to 15 Hz, inclusive. In some embodiments, actuator 408 can be an electromagnetic motor. In other embodiments, actuator 408 may be an electromagnetic drive, as shown in FIG. 5. Two actuators may be used with another actuator on the opposite end of MEMS structure 400 from actuator 408.

In certain embodiments, each of the rotatable MEMS mirrors 300 a-e is mounted linearly such that axis of rotation 403 bisects each rotatable MEMS mirror 300 a-e. Although FIG. 4 shows five rotatable MEMS mirrors 300 a-e, it is understood that this is merely an example; any number of rotatable MEMS mirrors 300 may be present in array 400. Additionally, although one row of rotatable MEMS mirrors 300 a-e is shown, it is understood that there may be more rows may be present in the array of MEMS structure 400. Any additional row may be similarly aligned on an axis parallel to axis 403 and rotatable about an axis parallel to axis 405.

Each of the rotatable MEMS mirrors 300 a-e in the MEMS structure 400 are shown to be connected at both ends to an array of second actuators 410, sometimes called "array of actuators." Array of actuators 410 include actuators 410 a-e and a'-e', respectively. Each actuator 410 a-e and a'-e' is operable to rotate a rotatable MEMS mirror 300 about its axis corresponding to axis 405. Note that references to "rotate" herein include tilting, since the mirrors are tilted to capture a pixel position, then tilted again for the next pixel position, rotating through a field of view. In some embodiments, actuator 410 a-e and a'-e' can be an electrostatic MEMS device as described in FIG. 3A and FIG. 3B, including comb fingers 306 and 312. In other embodiments, other suitable actuators may be implemented (e.g. piezoelectric, thermal, mechanical, etc.). One of ordinary skill in the art with the benefit of this disclosure would recognize many possible variations and modifications.

In some embodiments, each of mirrors 300 a-e has an axis of rotation parallel to axis 405 are perpendicular to axis 403. Array of actuators 410 is also operable to receive a signal from a controller (such as that shown in FIG. 5) via one or more traces on the PCB. In this way, each rotatable MEMS mirror 300 in the array can be controlled to rotate synchronously at a given frequency over a predetermined range of motion. In some embodiments, this frequency is a resonant frequency of rotatable MEMS mirror 300. In embodiments, this frequency is in the kilohertz range.

FIG. 5 is a block diagram of MEMS structure with an electromagnetic actuator according to certain embodiments. In the example shown in FIG. 5, MEMS structure 500 is rotated about a first axis of rotation 501 by an electromagnetic actuator. Axis 501 corresponds to axis 403 in FIG. 4. As described in FIG. 4, each rotatable MEMS mirror 300 in the array of rotatable MEMS mirrors can be simultaneously rotated about a corresponding, orthogonal second axis of rotation, such as axes 405 in order to synchronously rotate in two dimensions.

In certain embodiments, semiconducting chip 502 includes an array of rotatable MEMS mirrors similar to the one shown in FIG. 4, which includes at least one rotatable MEMS mirror 300 and is formed on a semiconducting chip and mounted on substrate (e.g., PCB) 504. Substrate 504 further includes a trace or other electrically conducting pathway which forms coil 506 surrounding semiconducting chip 502. A first opening 507 and second opening 509 are formed in substrate 504 in-between coil 506 and either side of semiconducting chip 502. First magnetic element 510 extends through first opening 507 and second magnetic element 511 extends through second opening 509. Third magnetic element 512 is positioned outside of substrate 504, such that coil 506 passes between first magnetic element 510 and third magnetic element 512. Fourth magnetic element 513 is positioned outside of substrate 504, such that coil 506 passes between second magnetic element 511 and fourth magnetic element 513. Magnetic elements 510, 511, 512, 513, and coil 506 comprise the electromagnetic actuator. Magnetic elements 510-513 can be iron, nickel permalloy, neodymium, alnico magnets, ferrite or other magnetic material in some embodiments. Elements 510 and 511 can be the permanent magnets in one embodiment.

Controller 514 can include one or more processors. Controller 514 can send a signal to electromagnetic driver 516. Upon receiving a signal from controller 514, electromagnetic driver 516 causes a pulse of current to flow through the trace or other electrically conducting pathway around coil 506. As the current passes through the coil, a magnetic field is generated by interaction with each of the pairs of magnetic elements 510-513. Substrate 504 experiences a Lorentz force, which causes substrate 504 to rotate about first axis of rotation 501. By varying the direction of the current, substrate 504 can be made to rotate in alternating directions about axis of rotation 501. Controller 514 can cause the electromagnetic driver 516 to rotate substrate 504 at a suitable frequency, such as 1 Hz to 15 Hz, inclusive.

In other embodiments, magnetic elements 510-513 can be electromagnets. Electromagnetic driver 516 can provide a constant current through coil 506. Electromagnetic driver 516 can also send a signal to magnetic elements 510-513 via trace or other suitable electrically conducting pathway, alternating the activation of a first pair of magnetic elements 510 and 512 with the activation of a second pair of magnetic elements 511 and 513. As each pair of magnetic elements is activated, a magnetic field is produced between the activated pair. Substrate 504 experiences a Lorentz force as current flows through coil 506. By alternating the activation of the pairs of elements 510-513, substrate 504 can be made to rotate in alternating directions about axis of rotation 501. Controller 514 can cause the electromagnetic driver 516 to rotate substrate 504 back and forth at a suitable frequency, such as 1 Hz to 15 Hz, inclusive.

Controller 514 is also operable to send a second signal to array of rotatable MEMS mirrors on semiconducting chip 502 via a trace on substrate 504 or other suitable method. Each rotatable MEMS mirror 300 in the array of rotatable MEMS mirrors synchronously rotates about a second axis of rotation, in response to the second signal. The second axis of rotation can be a corresponding axis 405, as described in FIG. 4. The second signal can cause each rotatable MEMS mirror 300 in array of rotatable MEMS mirrors to rotate at a predetermined frequency. In some embodiments, this frequency is a resonant frequency of rotatable MEMS mirror 300. This frequency can be in the kilohertz range, such as between 300 Hz and 20 KHz or between 5 and 10 KHz By driving substrate 504 about a first axis of rotation 501 at a first frequency and driving an each rotatable MEMS mirror 300 in an array rotatable MEMS mirrors 300 about a corresponding second axes, orthogonal to the first axis or rotation, two dimensional scanning can be achieved. This enables higher operating speeds than a larger mirror or mirrors while achieving a larger effective optical aperture. The scanning can be a raster scan, similar to that used to generate the pixels on a television. The high frequency rotations of the mirrors, in the kilohertz range, can do a horizontal scan for all the pixel positions in a row in the field of view (FOV) of the system. A lower frequency rotation is used to move the mirrors in a vertical direction, from one row to the next. As described, this can be, for example, in the range of 1-15 Hz. Since movement to the next row is required only after all the pixels in a row have been scanned, a much lower frequency is required for rotating to switch rows. In alternate embodiments, these can be reverse, with a low frequency switch of vertical columns and a high frequency scanning of all the pixel positions in a column.

The axis of rotation 501 in FIG. 5 can physically be on a thin portion of the PCB which acts as an axle 503 with cut-outs of the PCB material to form the gaps illustrated in FIG. 5. By making the PCB thin enough, it can rotate without requiring a lot of electromagnetic force. It is not too thin, so that it can support the structure. Additionally, it is a material that will not break after multiple rotations. In some embodiments, the PCB material is a composite material, such as FR-4, which can be bent or tilted many millions of times without breaking. In some embodiments, the vertical range is small, thus requiring tilting through axle 503 of only 2-15 degrees. In other embodiments, axle 503 is a structure integral with substrate 504, but with the end proximate EM driver 516 mounting in a receptacle mounted on the outer PCB 518. The receptacle need not be a ball-bearing element but can be some low friction element that allows rotation. The trace connection for the control and coil can be through a short wire bonded on each side with sufficient slack to allow rotation.

While FIG. 5 shows certain embodiments of a hybrid driving system using an electromagnetic actuator, the numbers and positions of the various components shown in FIG. 5 are only one example, shown for clarification purposes. In other embodiments, substrate 504 can be fabricated from steel, plastic, carbon composites, or other suitable material. In yet another embodiment, MEMS structure 400 can be mounted on a dedicated mechanical structure, controlled by controller 514. One of ordinary skill in the art with the benefit of this disclosure would recognize many possible variations and modifications.

Flowchart for Rotating an Array of Rotatable MEMS Mirrors

Figure 6:
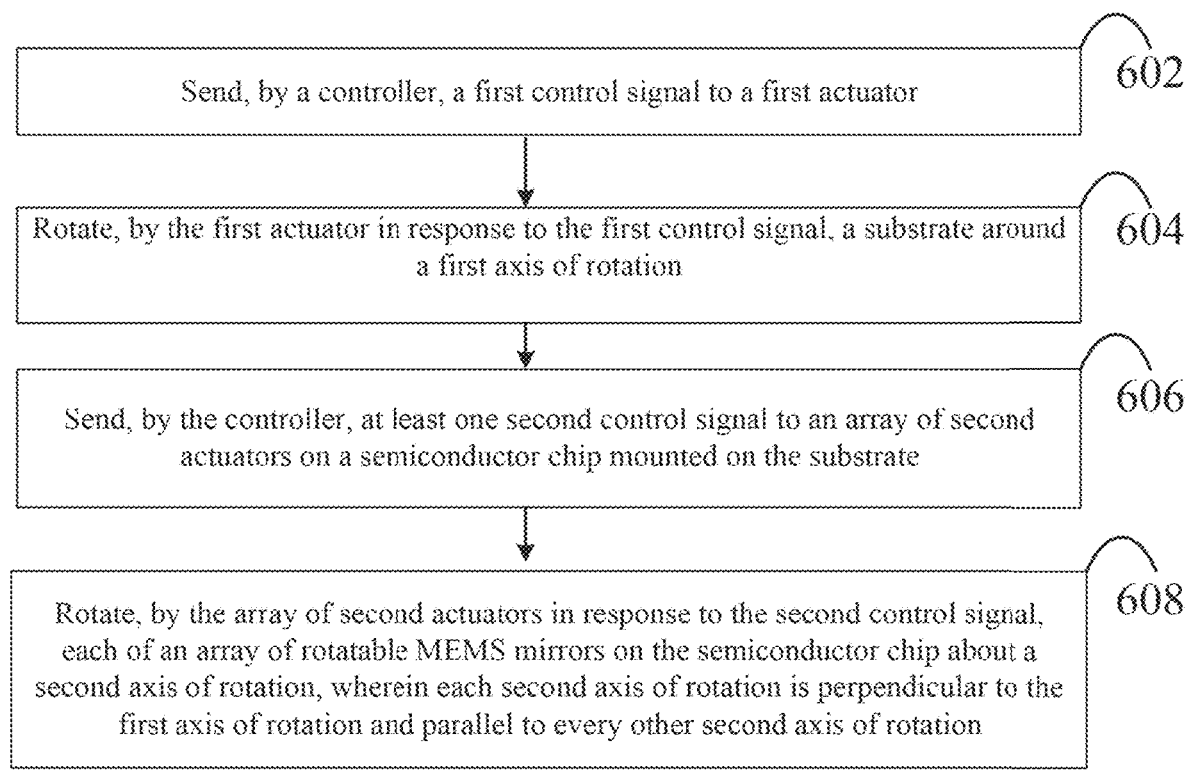
FIG. 6 is a flowchart of a method for rotating an array of rotatable MEMS mirrors synchronously in two dimensions, according to certain embodiments.

FIG. 6 is a flowchart of a method for rotating an array of rotatable MEMS mirrors synchronously in two dimensions according to certain embodiments. It will be appreciated that the operations described in process 600 can be performed in a different order and/or that one or more operations of process 600 need not be performed.

In block 602, a controller (such as controller 514 in FIG. 5) sends a first control signal to a first actuator. The first actuator may be the electromagnetic actuator shown in FIG. 5. In certain embodiments, the first control signal is sent to electromagnetic driver 516. The first control signal may be based on information regarding an operating frequency, angle of rotation, or any other necessary information.

In block 604, the first actuator rotates a substrate about a first axis of rotation in response to the first control signal. Referring to FIG. 5, electromagnetic driver 516 can cause a pulse of current to flow through coil 506 in either direction. Substrate 504 may rotate about the first axis of rotation at a suitable frequency. An example of a suitable frequency is from 1 Hz to 15 Hz, inclusive.

In block 606, the controller sends at least one second control signal to the an array of second actuators formed on a semiconductor chip. The second control signal may be sent along a trace printed on a Printed Control Board (PCB) or other suitable means. These actuators may be actuators 410 a-e as described by FIG. 4. The second actuators may be electrostatic comb actuators or other suitable actuators (e.g. piezoelectric, thermal, mechanical, etc.).

In block 608, each of the second actuators rotates each rotatable MEMS mirror of an array of rotatable MEMS mirrors on the semiconductor chip about a second axis of rotation. Each second axis of rotation can be perpendicular to the first axis of rotation and parallel to every other second axis of rotation. In some embodiments, each second actuator can cause each rotatable MEMS mirror to rotate at a frequency in the kilohertz range. In embodiments, each second actuator can cause each rotatable MEMS mirror to rotate at a resonant frequency of the rotatable MEMS mirror.

In summary, in some embodiments, an apparatus for tilting an array of mirrors is provided. The apparatus comprises the following elements:

A microelectromechanical system (MEMS) structure (400, 500) configured to redirect light in a light detection and ranging (LiDAR) system, the MEMS structure comprising: A substrate 404 comprising a printed circuit board (PCB);

An electromagnetic actuator (510, 511, 512, 513 & 506) configured to rotate the PCB about a first axis of rotation (501);

An array of rotatable MEMS mirrors formed on a semiconductor chip (402) mounted to the PCB and aligned parallel to the first axis of rotation, wherein each rotatable mirror is rotatable about a second axis of rotation (405), each second axis of rotation being perpendicular to the first axis of rotation and parallel to every other second axis of rotation;

An array of electrostatic comb actuators (306, 310, 314) configured to rotate each rotatable MEMS mirror in the array of rotatable MEMS mirrors about its second axis of rotation; and A controller (514) configured to cause the electromagnetic actuator to rotate the substrate about the first axis of rotation over a first range of motion at a first frequency and to cause the array of electrostatic comb actuators to synchronously rotate each rotatable MEMS mirror of the array of rotatable MEMS mirrors about its corresponding second axis of rotation over a second range of motion at a second frequency.

Example LiDAR System Implementing Aspects of Embodiments Herein

Figure 7:
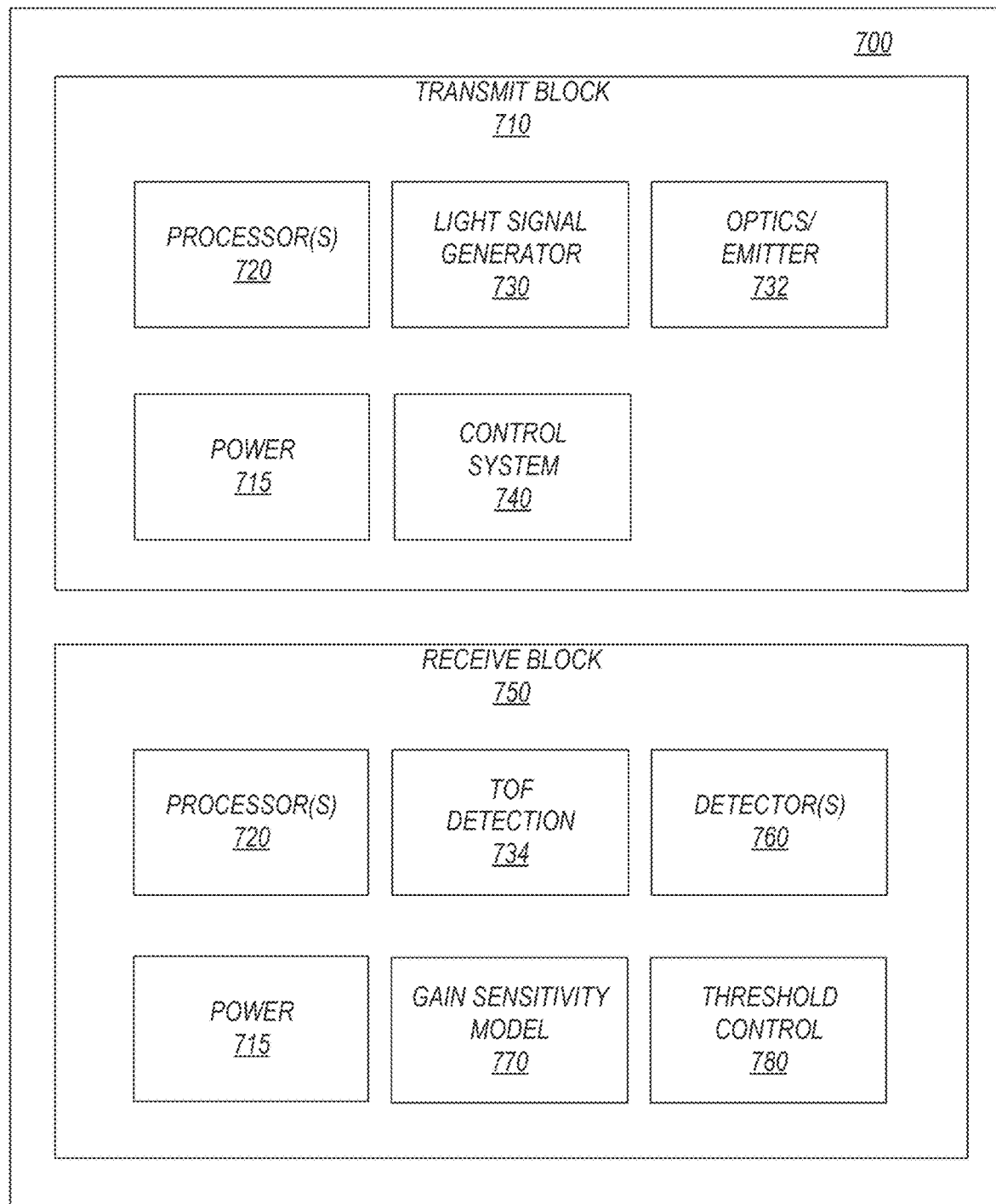
FIG. 7 illustrates a simplified block diagram showing aspects of a LiDAR-based detection system, according to certain embodiments of the invention.

FIG. 7 illustrates a simplified block diagram showing aspects of a LiDAR-based detection system 700, according to certain embodiments, in which the embodiments described above can be imbedded and controlled. System 700 may be configured to transmit, detect, and process LiDAR signals to perform object detection as described above with regard to LiDAR system 700 described in FIG. 1. In general, a LiDAR system 700 includes one or more transmitters (e.g., transmit block 710) and one or more receivers (e.g., receive block 750). LiDAR system 700 may further include additional systems that are not shown or described to prevent obfuscation of the novel features described herein.

Transmit block 710, as described above, can incorporate a number of systems that facilitate that generation and emission of a light signal, including dispersion patterns (e.g., 360 degree planar detection), pulse shaping and frequency control, Time-Of-Flight (TOF) measurements, and any other control systems to enable the LiDAR system to emit pulses in the manner described above. In the simplified representation of FIG. 7, transmit block 710 can include processor(s) 720, light signal generator 730, optics/emitter module 732, power block 715, and control system 740. Some or all of system blocks 730-740 can be in electrical communication with processor(s) 720.

In certain embodiments, processor(s) 720 may include one or more microprocessors (µCs) and can be configured to control the operation of system 700. Alternatively or additionally, processor 720 may include one or more microcontrollers (MCUs), digital signal processors (DSPs) or the like with supporting hardware, firmware (e.g., memory, programmable I/Os), and/or software, as would be appreciated by one of ordinary skill in the art. Alternatively, MCUs, µCs, DSPs, ASIC, programmable logic device, and the like, may be configured in other system blocks of system 700. For example, control system block 740 may include a local processor to certain control parameters (e.g., operation of the emitter), in particular, the frequency and angular range of motion of a substrate on which a semiconductor chip is mounted. Further, the local processor may control the rotation of each rotatable MEMS mirror in an array of rotatable MEMS mirrors. Processor(s) 720 may control some or all aspects of transmit block 710 (e.g., optics/emitter 732, control system 740, dual sided mirror 220 position as shown in FIG. 1, position sensitive device 250, etc.) and receive block 750 (e.g., processor(s) 720) or any aspects of LiDAR system 700. In some embodiments, multiple processors may enable increased performance characteristics in system 700 (e.g., speed and bandwidth); however, multiple processors are not required, nor necessarily germane to the novelty of the embodiments described herein. Alternatively or additionally, certain aspects of processing can be performed by analog electronic design, as would be understood by one of ordinary skill in the art.

Light signal generator 730 may include circuitry (e.g., a laser diode) configured to generate a light signal, which can be used as the LiDAR send signal, according to certain embodiments. In some cases, light signal generator 730 may generate a laser that is used to generate a continuous or pulsed laser beam at any suitable electromagnetic wavelengths spanning the visible light spectrum and non-visible light spectrum (e.g., ultraviolet and infra-red). In some embodiments, lasers are commonly in the range of 600-1200 nm, although other wavelengths are possible, as would be appreciated by one of ordinary skill in the art.

Optics/Emitter block 732 (also referred to as transmitter 732) may include one or more arrays of mirrors for redirecting and/or aiming the emitted laser pulse, mechanical structures to control spinning and/or moving of the emitter system, or other system to affect the system field-of-view, as would be appreciated by one of ordinary skill in the art with the benefit of this disclosure. For instance, some systems may incorporate a beam expander (e.g., convex lens system) in the emitter block that can help reduce beam divergence and increase the beam diameter. These improved performance characteristics may mitigate background return scatter that may add noise to the return signal. In some cases, optics/emitter block 732 may include a beam splitter to divert and sample a portion of the pulsed signal. For instance, the sampled signal may be used to initiate the TOF clock. In some cases, the sample can be used as a reference to compare with backscatter signals. Some embodiments may employ microelectromechanical mirrors (MEMS) that can reorient light to a target field. Alternatively or additionally, multi-phased arrays of lasers may be used. Any suitable system may be used to emit the LiDAR send pulses, as would be appreciated by one of ordinary skill in the art.

Power block 715 can be configured to generate power for transmit block 710, receive block 750, as well as manage power distribution, charging, power efficiency, and the like. In some embodiments, power management block 715 can include a battery (not shown) and a power grid within system 700 to provide power to each subsystem (e.g., control system 740). The functions provided by power management block 715 may be subsumed by other elements within transmit block 710 or may provide power to any system in LiDAR system 700. Alternatively, some embodiments may not include a dedicated power block and power may be supplied by a number of individual sources that may be independent of one another.

Control system 740 may control aspects of light signal generation (e.g., pulse shaping), optics/emitter control, TOF timing, or any other function described herein. In some cases, aspects of control system 740 may be subsumed by processor(s) 720, light signal generator 730, or any block within transmit block 710 or LiDAR system 700 in general.

Receive block 750 may include circuitry configured to detect and process a return light pulse to determine a distance of an object and, in some cases, determine the dimensions of the object, the velocity and/or acceleration of the object, and the like. Processor(s) 765 may be configured to perform operations such as processing received return pulses from detectors(s) 760, controlling the operation of TOF module 734, controlling threshold control module 780, or any other aspect of the functions of receive block 750 or LiDAR system 700 in general.

TOF module 734 may include a counter for measuring the time-of-flight of a round trip for a send and return signal. In some cases, TOF module 734 may be subsumed by other modules in LiDAR system 700, such as control system 740, optics/emitter 732, or other entity. TOF modules 734 may implement return "windows" that limit a time that LiDAR system 700 looks for a particular pulse to be returned. For example, a return window may be limited to a maximum amount of time it would take a pulse to return from a maximum range location (e.g., 250 m). Some embodiments may incorporate a buffer time (e.g., maximum time plus 10%). TOF module 734 may operate independently or may be controlled by other system block, such as processor(s) 720, as described above. In some embodiments, the transmit block may also include a TOF detection module. One of ordinary skill in the art with the benefit of this disclosure would appreciate the many modifications, variations, and alternative ways of implementing the TOF detection block in system 700.

Detector(s) 760 may detect incoming return signals that have reflected off of one or more objects. In some cases, LiDAR system 700 may employ spectral filtering based on wavelength, polarization, and/or range to help reduce interference, filter unwanted frequencies, or other deleterious signals that may be detected. In particular, a narrow passband filter can be used, either static or dynamic. A passband as narrow as 20 or even 15 nm may be used. Typically, detector(s) 760 can detect an intensity of light and records data about the return signal (e.g., via coherent detection, photon counting, analog signal detection, or the like). Detector (s) 760 can use any suitable photodetector technology including solid state photodetectors (e.g., silicon avalanche photodiodes, complimentary metal-oxide semiconductors (CMOS), charge-coupled devices (CCD), hybrid CMOS/CCD devices) or photomultipliers. In some cases, a single receiver may be used or multiple receivers may be configured to operate in parallel.

Gain sensitivity model 770 may include systems and/or algorithms for determining a gain sensitivity profile that can be adapted to a particular object detection threshold. The gain sensitivity profile can be modified based on a distance (range value) of a detected object (e.g., based on TOF measurements). In some cases, the gain profile may cause an object detection threshold to change at a rate that is inversely proportional with respect to a magnitude of the object range value. A gain sensitivity profile may be generated by hardware/software/firmware, or gain sensor model 770 may employ one or more look up tables (e.g., stored in a local or remote database) that can associate a gain value with a particular detected distance or associate an appropriate mathematical relationship there between (e.g., apply a particular gain at a detected object distance that is 10% of a maximum range of the LiDAR system, apply a different gain at 15% of the maximum range, etc.). In some cases, a Lambertian model may be used to apply a gain sensitivity profile to an object detection threshold. The Lambertian model typically represents perfectly diffuse (matte) surfaces by a constant bidirectional reflectance distribution function (BRDF), which provides reliable results in the LiDAR system as described herein. However, any suitable gain sensitivity profile can be used including, but not limited to, Oren-Nayar model, Nanrahan-Krueger model, Cook-Torrence model, Diffuse BRDF model, Limmel-Seeliger model, Blinn-Phong model, Ward model, HTSG model, Fitted Lafortune model, or the like. One of ordinary skill in the art with the benefit of this disclosure would understand the many alternatives, modifications, and applications thereof.

Threshold control block 780 may set an object detection threshold for LiDAR system 700. For example, threshold control block 780 may set an object detection threshold over a certain full range of detection for LiDAR system 700. The object detection threshold may be determined based on a number of factors including, but not limited to, noise data (e.g., detected by one or more microphones) corresponding to an ambient noise level and false positive data (typically a constant value) corresponding to a rate of false positive object detection occurrences for the LiDAR system. In some embodiments, the object detection threshold may be applied to the maximum range (furthest detectable distance) with the object detection threshold for distances ranging from the minimum detection range up to the maximum range being modified by a gain sensitivity model (e.g., Lambertian model).

Although certain systems may not be expressly discussed, they should be considered as part of system 700, as would be understood by one of ordinary skill in the art. For example, system 700 may include a bus system (e.g., CAMBUS) to transfer power and/or data to and from the different systems therein. In some embodiments, system 700 may include a storage subsystem (not shown). A storage subsystem can store one or more software programs to be executed by processors (e.g., in processor(s) 720). It should be understood that "software" can refer to sequences of instructions that, when executed by processing unit(s) (e.g., processors, processing devices, etc.), cause system 700 to perform certain operations of software programs. The instructions can be stored as firmware residing in read only memory (ROM) and/or applications stored in media storage that can be read into memory for processing by processing devices. Software can be implemented as a single program or a collection of separate programs and can be stored in non-volatile storage and copied in whole or in part to volatile working memory during program execution. From a storage subsystem, processing devices can retrieve program instructions to execute in order to execute various operations (e.g., software-controlled spring auto-adjustment, etc.) as described herein. Some software controlled aspects of LiDAR system 700 may include aspects of gain sensitivity model 770, threshold control 780, control system 740, TOF module 734, or any other aspect of LiDAR system 700.

It should be appreciated that system 700 is meant to be illustrative and that many variations and modifications are possible, as would be appreciated by one of ordinary skill in the art. System 700 can include other functions or capabilities that are not specifically described here. For example, LiDAR system 700 may include a communications block (not shown) configured to enable communication between LiDAR system 700 and other systems of the vehicle or remote resource (e.g., remote servers), etc., according to certain embodiments. In such cases, the communications block can be configured to provide wireless connectivity in any suitable communication protocol (e.g., radio-frequency (RF), Bluetooth, BLE, infra-red (IR), ZigBee, Z-Wave, Wi-Fi, or a combination thereof).

While system 700 is described with reference to particular blocks (e.g., threshold control block 780), it is to be understood that these blocks are defined for understanding certain embodiments of the invention and it is not implied or intended that embodiments are limited to a particular physical arrangement of component parts. The individual blocks need not correspond to physically distinct components. Blocks can be configured to perform various operations (e.g., by programming a processor or providing appropriate processes), and various blocks may or may not be reconfigurable depending on how the initial configuration is obtained. Certain embodiments can be realized in a variety of apparatuses including electronic devices implemented using any combination of circuitry and software. Furthermore, aspects and/or portions of system 700 may be combined with or operated by other sub-systems as informed by design. For example, power management block 715 and/or threshold control block 780 may be integrated with processor(s) 720 instead of functioning as separate entities.

Example Computer Systems Implementing Aspects of Embodiments Herein

Figure 8:
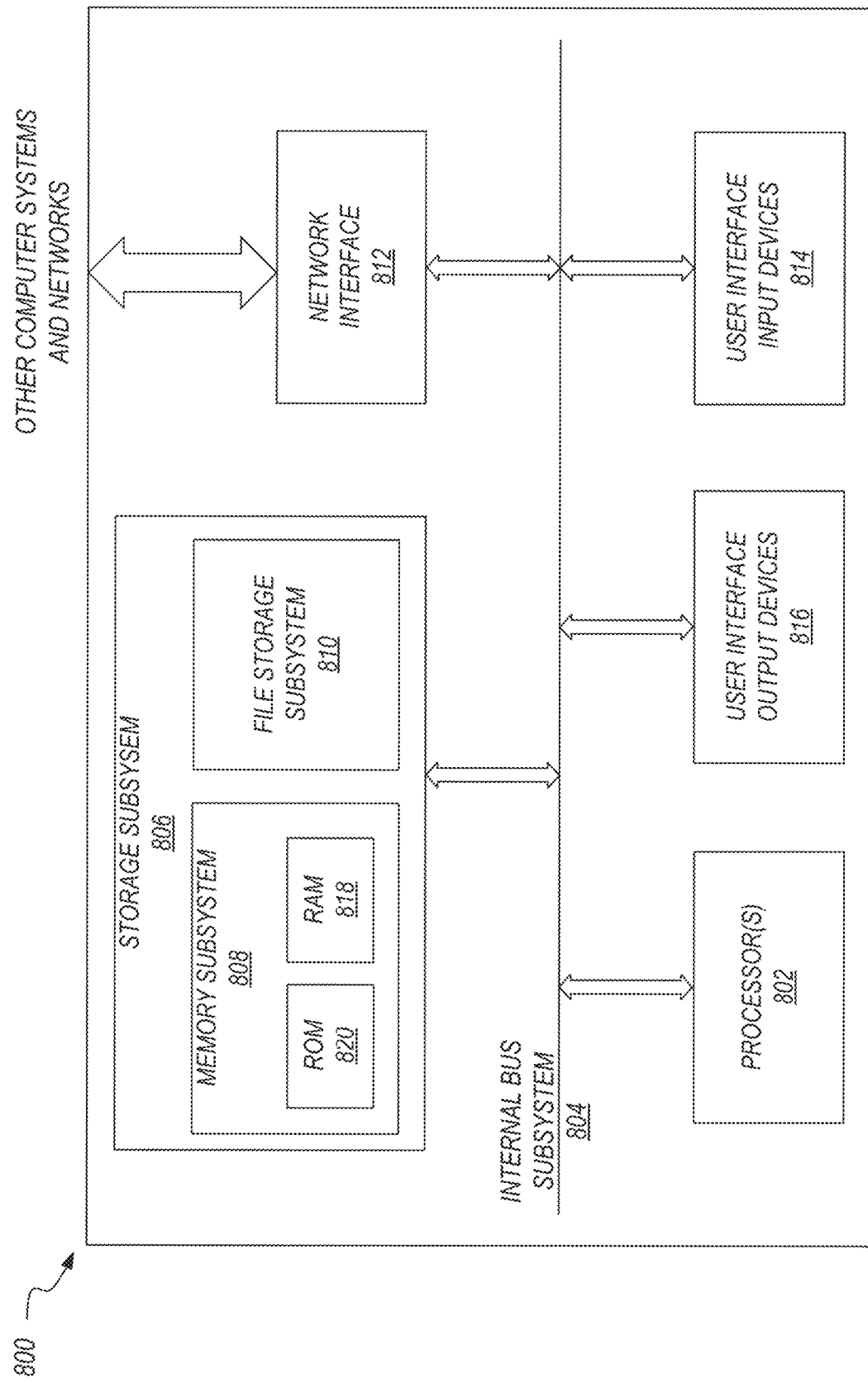
FIG. 8 illustrates an example computer system that may be utilized to implement techniques disclosed herein, according to certain embodiments of the invention.

FIG. 8 is a simplified block diagram of a computing system 800 configured to operate aspects of a LiDAR-based detection system according to certain embodiments. Computing system 800 can be used to implement any of the systems and modules discussed above with respect to FIGS. 1-5. For example, computing system 800 may operate aspects of threshold control 780, TOF module 734, processor(s) 720, control system 740, or any other element of LiDAR system 700 or other system described herein. Computing system 800 can include, for example, a field programmable gate array (FPGA), an application specific integrated circuit (ASIC), and a general purpose central processing unit (CPU) to implement the disclosed techniques, including the techniques described from FIG. 1-FIG. 6, such as controller 514. In some examples, computing system 800 can also include one or more processors 802 that can communicate with a number of peripheral devices (e.g., input devices) via a bus subsystem 804. Processors 802 can be an FPGA, an ASIC, a CPU, etc. These peripheral devices can include storage subsystem 806 (comprising memory subsystem 808 and file storage subsystem 810), user interface input devices 814, user interface output devices 816, and a network interface subsystem 812.

In some examples, internal bus subsystem 804 (e.g., CAMBUS) can provide a mechanism for letting the various components and subsystems of computer system 800 communicate with each other as intended. Although internal bus subsystem 804 is shown schematically as a single bus, alternative embodiments of the bus subsystem can utilize multiple buses. Additionally, network interface subsystem 812 can serve as an interface for communicating data between computing system 800 and other computer systems or networks. Embodiments of network interface subsystem 812 can include wired interfaces (e.g., Ethernet, CAN, RS232, RS485, etc.) or wireless interfaces (e.g., ZigBee, Wi-Fi, cellular, etc.).

In some cases, user interface input devices 814 can include a keyboard, pointing devices (e.g., mouse, trackball, touchpad, etc.), a barcode scanner, a touch-screen incorporated into a display, audio input devices (e.g., voice recognition systems, microphones, etc.), Human Machine Interfaces (HMI), and other types of input devices. In general, use of the term "input device" is intended to include all possible types of devices and mechanisms for inputting information into computing system 800. Additionally, user interface output devices 816 can include a display subsystem, a printer, or non-visual displays such as audio output devices, etc. The display subsystem can be any known type of display device. In general, use of the term "output device" is intended to include all possible types of devices and mechanisms for outputting information from computing system 800.

Storage subsystem 806 can include memory subsystem 808 and file/disk storage subsystem 810. Subsystems 808 and 810 represent non-transitory computer-readable storage media that can store program code and/or data that provide the functionality of embodiments of the present disclosure. In some embodiments, memory subsystem 808 can include a number of memories including main random access memory (RAM) 818 for storage of instructions and data during program execution and read-only memory (ROM) 820 in which fixed instructions may be stored. File storage subsystem 810 can provide persistent (i.e., non-volatile) storage for program and data files and can include a magnetic or solid-state hard disk drive, an optical drive along with associated removable media (e.g., CD-ROM, DVD, Blu-Ray, etc.), a removable flash memory-based drive or card, and/or other types of storage media known in the art.

It should be appreciated that computer system 800 is illustrative and not intended to limit embodiments of the present disclosure. Many other configurations having more or fewer components than system 800 are possible.

The various embodiments further can be implemented in a wide variety of operating environments, which in some cases can include one or more user computers, computing devices or processing devices, which can be used to operate any of a number of applications. User or client devices can include any of a number of general purpose personal computers, such as desktop or laptop computers running a standard operating system, as well as cellular, wireless and handheld devices running mobile software and capable of supporting a number of networking and messaging protocols. Such a system also can include a number of workstations running any of a variety of commercially available operating systems and other known applications for purposes such as development and database management. These devices also can include other electronic devices, such as dummy terminals, thin-clients, gaming systems, and other devices capable of communicating via a network.

Most embodiments utilize at least one network that would be familiar to those skilled in the art for supporting communications using any of a variety of commercially available protocols, such as TCP/IP, UDP, OSI, FTP, UPnP, NFS, CIFS, and the like. The network can be, for example, a local-area network, a wide-area network, a virtual private network, the Internet, an intranet, an extranet, a public switched telephone network, an infrared network, a wireless network, and any combination thereof.

In embodiments utilizing a network server, the network server can run any of a variety of server or mid-tier applications, including HTTP servers, FTP servers, CGI servers, data servers, Java servers, and business application servers. The server(s) also may be capable of executing programs or scripts in response to requests from user devices, such as by executing one or more applications that may be implemented as one or more scripts or programs written in any programming language including, but not limited to, Java®, C, C# or C++, or any scripting language, such as Perl, Python or TCL, as well as combinations thereof. The server(s) may also include database servers including, without limitation, those commercially available from Oracle®, Microsoft®, Sybase®, and IBM®.

The environment can include a variety of data stores and other memory and storage media as discussed above. These can reside in a variety of locations, such as on a storage medium local to (and/or resident in) one or more of the computers or remote from any or all of the computers across the network. In a particular set of embodiments, the information may reside in a storage-area network (SAN) familiar to those skilled in the art. Similarly, any necessary files for performing the functions attributed to the computers, servers, or other network devices may be stored locally and/or remotely, as appropriate. Where a system includes computerized devices, each such device can include hardware elements that may be electrically coupled via a bus, the elements including, for example, at least one central processing unit (CPU), at least one input device (e.g., a mouse, keyboard, controller, touch screen or keypad), and at least one output device (e.g., a display device, printer or speaker). Such a system may also include one or more storage devices, such as disk drives, optical storage devices, and solid-state storage devices such as RAM or ROM, as well as removable media devices, memory cards, flash cards, etc.

Such devices also can include a computer-readable storage media reader, a communications device (e.g., a modem, a network card (wireless or wired), an infrared communication device, etc.), and working memory as described above. The computer-readable storage media reader can be connected with or configured to receive a non-transitory computer-readable storage medium, representing remote, local, fixed, and/or removable storage devices, as well as storage media for temporarily and/or more permanently containing, storing, transmitting, and retrieving computer-readable information. The system and various devices also typically will include a number of software applications, modules, services, or other elements located within at least one working memory device including an operating system and application programs, such as a client application or browser. It should be appreciated that alternate embodiments may have numerous variations from that described above. For example, customized hardware might also be used and/or particular elements might be implemented in hardware, software (including portable software, such as applets), or both. Further, connection to other computing devices such as network input/output devices may be employed.

Non-transitory storage media and computer-readable storage media for containing code or portions of code can include any appropriate media known or used in the art such as, but not limited to, volatile and non-volatile, removable and non-removable media implemented in any method or technology for the storage of information such as computer-readable instructions, data structures, program modules or other data, including RAM, ROM, Electrically Erasable Programmable Read-Only Memory (EEPROM), flash memory or other memory technology, CD-ROM, DVD or other optical storage, magnetic cassettes, magnetic tape, magnetic disk storage or other magnetic storage devices, or any other medium which can be used to store the desired information and which can be accessed by a system device. Based on the disclosure and teachings provided herein, a person of ordinary skill in the art will appreciate other ways and/or methods to implement the various embodiments. However, computer-readable storage media does not include transitory media such as carrier waves or the like.

Other variations are within the spirit of the present disclosure. Thus, while the disclosed techniques are susceptible to various modifications and alternative constructions, certain illustrated examples thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims. For instance, any of the examples, alternative examples, etc., and the concepts thereof may be applied to any other examples described and/or within the spirit and scope of the disclosure.

For example, instead of using a single laser to illuminate the array of MEMS mirrors, an array of mirrors may be used. Also, the pattern generation and decoding could be hard-wired, in firmware, or in software in different embodiments.

The structure of the present invention can be used in a variety of other applications than LIDAR. Light beam steering techniques can also be used in other optical systems, such as optical display systems (e.g., TVs), optical sensing systems, optical imaging systems, and the like. In various light beam steering systems, the light beam may be steered by, for example, a rotating platform driven by a motor, a multi-dimensional mechanical stage, a Galvo-controlled mirror, a resonant fiber, an array of rotatable microelectromechanical (MEMS) mirrors, or any combination thereof. A rotatable MEMS micro-mirror may be rotated around a pivot or connection point by, for example, a micro-motor, an electromagnetic actuator, an electrostatic actuator, or a piezoelectric actuator.

The MEMS mirror structure of the present invention can have the mirror mass driven by different types of actuators. In some light steering systems, the transmitted or received light beam may be steered by an array of micro-mirrors. Each micro-mirror may rotate around a pivot or connection point to deflect light incident on the micro-mirror to desired directions. The performance of the micro-mirrors may directly affect the performance of the light steering system, such as the field of view (FOV), the quality of the point cloud, and the quality of the image generated using a light steering system. For example, to increase the detection range and the FOV of a LiDAR system, micro-mirrors with large rotation angles and large apertures may be used, which may cause an increase in the maximum displacement and the moment of inertia of the micro-mirrors. To achieve a high resolution, a device with a high resonant frequency may be used, which may be achieved using a rotating structure with a high stiffness. It may be difficult to achieve this desired performance using electrostatic actuated micro-mirrors because comb fingers used in an electrostatic-actuated micro-mirror may not be able to provide the force and movement needed and may disengage at large rotation angles, in particular, when the aperture of the micro-mirror is increased to improve the detection range. Some piezoelectric actuators may be used to achieve large displacements and large scanning angles due to their ability to provide a substantially larger drive force than electrostatic-actuated types with a relatively lower voltage.

The use of the terms "a" and "an" and "the" and similar referents in the context of describing the disclosed examples (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. The phrase "based on" should be understood to be open-ended, and not limiting in any way, and is intended to be interpreted or otherwise read as "based at least in part on," where appropriate. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate examples of the disclosure and does not pose a limitation on the scope of the disclosure unless otherwise claimed. No language in the specification should be construed as indicating any non-claimed element as essential to the practice of the disclosure.

What is claimed is:

1. A microelectromechanical system (MEMS) structure configured to redirect light in a light detection and ranging (LiDAR) system, the MEMS structure comprising:
    a substrate configured to rotate about a first axis of rotation;
    a first actuator configured to rotate the substrate about the first axis of rotation;
    an array of rotatable MEMS mirrors formed on a semiconductor chip mounted to the substrate, wherein each rotatable mirror is rotatable about a second axis of rotation which is parallel to every other second axis of rotation; and
    a second actuator, different from the first actuator, configured to rotate the array of rotatable MEMS mirrors about the second axis of rotation.

2. The MEMS structure of claim 1 further comprising:
    a coil on the substrate surrounding the semiconductor chip;
    a first magnetic element extending through a first opening in the substrate on a first side between the semiconductor chip and the coil;
    a second magnetic element extending through a second opening in the substrate on a second side opposite the first side between the semiconductor chip and the coil;
    a third magnetic element outside the substrate opposite the first magnetic element, such that a first portion of the coil is between the first and third magnetic elements; and
    a fourth magnetic element outside the substrate opposite the second magnetic element, such that a second portion of the coil is between the second and fourth magnetic elements.

3. The MEMS structure of claim 1 further comprising a motor configured to rotate the substrate about the first axis of rotation.

4. The MEMS structure of claim 1 further comprising a first actuator configured to rotate the substrate about the first axis of rotation over a first range of motion at a first frequency; and
    a second actuator configured to synchronously rotate each rotatable MEMS mirror of the array of rotatable MEMS mirrors about its corresponding second axis of rotation over a second range of motion at a second frequency, wherein the first frequency is between 1-15 Hz and the second frequency is in a kilohertz range.

5. The MEMS structure of claim 1 further comprising a first actuator configured to rotate the substrate about the first axis of rotation over a first range of motion at a first frequency;
    a second actuator configured to synchronously rotate each rotatable MEMS mirror of the array of rotatable MEMS mirrors about its corresponding second axis of rotation over a second range of motion at a second frequency; wherein the second frequency is a resonant frequency of each rotatable MEMS mirror.

6. The MEMS structure of claim 1 wherein the first axis of rotation provides vertical scanning.

7. A microelectromechanical system (MEMS) structure, the MEMS comprising:
    a substrate;
    a first actuator configured to rotate the substrate about a first axis of rotation;
    an array of rotatable MEMS mirrors mounted on the substrate aligned parallel to the first axis of rotation, wherein each rotatable MEMS mirror is rotatable about a second axis of rotation, each second axis of rotation being perpendicular to the first axis of rotation and parallel to every other second axis of rotation;
    an array of second actuators, different from the first actuator, mounted on the substrate and configured to rotate each rotatable MEMS mirror in the array of rotatable MEMS mirrors about its corresponding second axis of rotation; and a controller configured to control the first actuator to rotate the substrate about the first axis of rotation over a first range of motion and to control the array of second actuators to rotate each rotatable MEMS mirror of the array of rotatable MEMS mirrors about its corresponding second axis of rotation over a second range of motion.

8. The MEMS structure of claim 7 wherein the substrate comprises a printed circuit board (PCB), and the array of rotatable MEMS mirrors and the array of second actuators are formed on a semiconductor chip mounted on the PCB.

9. The MEMS structure of claim 8 wherein the first actuator comprises an electromagnetic actuator configured to rotate the substrate about the first axis of rotation, the electromagnetic actuator comprising:
 an electromagnetic driver;
 a coil on the PCB surrounding the semiconductor chip;
 a first magnetic element extending through a first opening in the PCB on a first side between the semiconductor chip and the coil;
 a second magnetic element extending through a second opening in the PCB on a second side opposite the first side between the semiconductor chip and the coil;
 a third magnetic element outside the PCB opposite the first magnetic element, such that a first portion of the coil is between the first and third magnetic elements; and
 a fourth magnetic element outside the PCB opposite the second magnetic element, such that a second portion of the coil is between the second and fourth magnetic elements.

10. The MEMS structure of claim 7 wherein the first actuator comprises an electromagnetic motor configured to rotate the substrate about the first axis of rotation.

11. The MEMS structure of claim 7 wherein the first actuator comprises a piezoelectric actuator configured to rotate the substrate about the first axis of rotation.

12. The MEMS structure of claim 7 wherein each of the array of second actuators comprises an electrostatic comb actuator configured to rotate the corresponding rotatable MEMS mirror of the array of rotatable MEMS mirrors about its corresponding second axis of rotation.

13. The MEMS structure of claim 7 wherein the controller is configured to cause the first actuator to rotate the substrate about the first axis of rotation at a first frequency between 1-15 Hz and to cause the array of second actuators to synchronously rotate each rotatable MEMS mirror of the array of rotatable MEMS mirrors about its corresponding second axis of rotation at a second frequency in a kilohertz range.

14. The MEMS structure of claim 13 wherein the second frequency is a resonant frequency of the MEMS mirrors.

15. The MEMS structure of claim 7 wherein the first axis of rotation provides vertical scanning.

16. A method of operating a microelectromechanical system (MEMS) to redirect light in a light detection and ranging system (LiDAR) comprising:
 sending, by a controller, a first control signal to a first actuator;
 rotating, by the first actuator in response to the first control signal, a substrate around a first axis of rotation;
 sending, by the controller, at least one second control signal to an array of second actuators, different from the first actuator, formed on a semiconductor chip and mounted on the substrate; and
 rotating, by the array of second actuators in response to the second control signal, each rotatable MEMS mirror of an array of rotatable MEMS mirrors on the semiconductor chip about a second axis of rotation, wherein each second axis of rotation is perpendicular to the first axis of rotation and parallel to every other second axis of rotation.

17. The method of claim 16 further comprising sending, by the controller, the first and second control signals via a trace on the substrate.

18. The method of claim 16 wherein rotating by the first actuator comprises applying an electromagnetic field to rotate the substrate about the first axis of rotation.

19. The method of claim 16 wherein rotating, by the first actuator in response to the first control signal, a substrate around a first axis of rotation further comprises rotating the substrate at a first frequency between 1-15 Hz; and
 rotating, by the array of second actuators in response to the second control signal, each of an array of rotatable MEMS mirrors on the semiconductor chip about a second axis of rotation at a second frequency in a kilohertz range.

20. The method of claim 16 further comprising rotating the rotatable MEMS mirrors at a resonant frequency of the rotatable MEMS mirrors.

* * * * *